United States Patent [19]

Hatakeyama

[11] Patent Number: 4,727,408
[45] Date of Patent: Feb. 23, 1988

[54] SEMICONDUCTOR DEVICE WITH HIGH BREAKDOWN VOLTAGE VERTICAL TRANSISTOR AND FABRICATING METHOD THEREFOR

[75] Inventor: Mikio Hatakeyama, Tokyo, Japan
[73] Assignee: NEC Corporation, Tokyo, Japan
[21] Appl. No.: 743,411
[22] Filed: Jun. 11, 1985
[30] Foreign Application Priority Data
Jun. 11, 1984 [JP] Japan .................. 59-119600
[51] Int. Cl.$^4$ .................................. H01L 29/34
[52] U.S. Cl. ........................ 357/52; 357/34; 357/46; 357/13
[58] Field of Search ............. 357/34, 52, 46, 13; 307/565

[56] References Cited

U.S. PATENT DOCUMENTS

4,282,555 8/1981 Svedberg .................. 357/13
4,355,322 10/1982 Spellman .................. 357/34
4,626,882 12/1986 Cottrell .................... 357/13

FOREIGN PATENT DOCUMENTS

57-34360 2/1982 Japan .................. 357/23.1

*Primary Examiner*—Martin H. Edlow
*Attorney, Agent, or Firm*—Burns, Doane, Swecker & Mathis

[57] ABSTRACT

A semiconductor device comprises a semiconductor substrate, a vertical transistor formed in the substrate, highly doped regions selectively and concurrently formed within the base region and the collector region by ion-implantation method etc., respectively, the one highly doped region within the collector region being spaced from the base region, the other highly doped regions within the base region serving as base ohmic contact regions, a clamping diode consisting of a junction between the one highly doped region and the collector region and having breakdown voltage lower than a breakdown voltage across the collector and the emitter regions of the transistor, and a connection conductor formed on the substrate so as to electrically connect the one of the base ohmic contact regions with the one highly doped region for forming the junction of the clamping diode. The transistor device provided with the above-featured clamping diode structure can prevent undesired parasitic transistor effect from being produced. There is also provided a method of fabricating a high breakdown voltage vertical transistor device by which the above-mentioned clamping diode structure can be monolithically formed with a high efficiency.

7 Claims, 8 Drawing Figures

SEMICONDUCTOR DEVICE WITH HIGH BREAKDOWN VOLTAGE VERTICAL TRANSISTOR AND FABRICATING METHOD THEREFOR

BACKGROUND OF THE INVENTION

The present invention relates to a semiconductor device with a high breakdown voltage vertical transistor of monolithic structure provided with a clamping diode and fabricating method therefor.

For protecting a transistor from an externally applied surge current or an overvoltage induced by inductance in a switching circuit, there has been usually adopted in the art a measure to insert a clamping diode, e.g., a Zener diode between the collector and the base of the transistor.

In this instance, when the transistor to be protected is of lateral type, the clamping diode and each region of the transistor can be separated from each other. Accordingly, semiconductor devices having desired breakdown voltage characteristics in compliance with their use can be monolithically configured with ease. In contrast, in the case where the transistor to be protected is of vertical type, it is impossible to insert a clamping diode with the clamping diode and each region of the transistor separated from each other. Namely, the clamping diode is formed as a PN-junction between the collector region of the transistor and a doped region containing an opposite type dopant formed within the collector region thereof, resulting in the provision of the PN-junction with the doped region internally connected to the collector region for the transistor action. This means that the PN-junction cannot also be formed independently of regions in a lateral direction of the transistor, i.e. base and emitter regions of the transistor. Accordingly, the design of the vertical transistor is restricted by mutual interference between the PN-junction forming the clamping diode and each region of the transistor aligned in the lateral direction. For this reason, transistor devices used for high breakdown voltage cannot be monolithically configured with ease.

For instance, Japanese Patent Application Laid-open No. 57-34360 entitled "Semiconductor Device" discloses a vertical transistor wherein ion-implantation is implemented over the entire surface of the collector region to form a doped region having the same conductivity type as the collector region and a shallow depth from the surface of a semicondutor substrate so that a PN-junction is formed between the doped region and the base region adjacent thereto, thus allowing the PN-junction to serve as a clamping diode. With this vertical transistor, the breakdown voltage of the newly formed PN-junction between the doped region and the base region can be considerably lowered as compared to the breakdown voltage of a junction between the collector and the base regions of the transistor. Accordingly, in the event that an overvoltage, e.g., a surge voltage is impressed across the collector and the emitter, the PN-jucntion breaks down prior to the breakdown of the junction between the collector and the base, allowing an overcurrent to flow from the base region to ground, thus enabling the PN-junction to function as a clamping diode.

However, for the reason stated above, such a clamping diode structure is subjected to mutual interference between the PN-junction forming the clamping diode and each region of the transistor aligned in parallel, thus making it impossible to configure a transistor device for high breakdown voltage and high electric current. Assuming now that the semiconductor substrate is an N-type and the vertical transistor is of NPN structure, the clamping diode is formed by an N+ region formed in the surface of the substrate and an adjoining P-type region serving as the base. It is further assumed that a large overvoltage (e.g., 400 to 500 volts) is applied across the collector and the emitter. A large negative voltage due to the overvoltage is applied to the emitter and the overvoltage is applied to the junction of the clamping diode in a reverse direction. As a result, a large number of electrons are injected from the N+ region serving as the emitter to the P-type base region. These electrons are attracted by a strong electric field based on the overvoltage to pass through the junction of the clamping diode, eventually arriving at its N+ region. Namely, injection of a large number of positive holes from the N+ region for forming the junction of the clamping diode into the base region is initiated. Thus, the N+ region serving as the emitter, the P-type region serving as the base and the N+ region forming the junction of the clamping diode form a parasitic transistor with these regions serving as the emitter, the base and the collector, respectively. Therefore, this parasitic effect not only allows the junction of the clamping diode to secondarily break down, but also causes the transistor itself to be protected to be broken. Accordingly, with such a clamping diode structure, the fabrication of a transistor device having at most a breakdown voltage of approximately 100 volts is only possible. For the reasons stated above, monolithic high breakdown voltage vertical transistor devices with clamping diode are difficult to fabricate.

SUMMARY OF THE INVENTION

Accordingly, an object of the present invention is to provide a high breakdown voltage vertical transistor device provided with a clamping diode structure configured to prevent the above-mentioned parasitic transistor effect from being produced.

Another object of the present invention is to provide a method of fabricating a high breakdown vertical transistor device by which the above-mentioned improved clamping diode structure is monolithically formed with high efficiency.

According to the present invention, there is provided a semiconductor device with a vertical transistor comprising: a collector region of a first conductivity type; a base region of a second conductivity type formed in the collector region; and emitter region of the first conductivity type formed within the base region; a first highly doped region of the second conductivity type formed within the collector region so that it is laterally spaced from the base region, thus forming a clamping diode consisting of a junction between the first highly dope region and the collector region, the junction having a breakdown voltage lower than a breakdown voltage across the collector and emitter regions; and a connection conductor formed on one major surface of the substrate so as to electrically connect the base region with the highly doped region.

At least two second highly doped regions serving as ohmic contact regions are formed within the base region. The connection conductor is formed so as to electrically connect the first highly doped region with one of the second highly doped regions.

The first highly doped region is spaced from the base region to such an extent that the first highly doped region and the base region are contiguously joined by depletion layers extending from the respective regions when an overvoltage is suppressed. The first highly doped region has a doping concentration as that of each ohmic contact region.

The collector region may comprise a semiconductor substrate of the first conductivity type, and the semicondcutor device with vertical transistor may further comprises a third highly doped region of the first conductivity type for mounting a collector elecrode thereon. The third highly doped region is formed on a major surface of the substrate. When the first conductivity type is an N-type and the second conductivity type is a P+-type, the junction profile of the respective semiconductor regions has a range such that the N-type collector region has a donor doping concentratiom lower than $2 \times 10^{14}$ atoms per $cm^3$, the P-type base region has a surface concentractionm ranging from $1 \times 10^{16}$ to $2 \times 10^{18}$ atoms per $cm^3$ and a junction depth more than 10 micron, the P+ohmic contact region has a doping concentration ranging from $5 \times 10^{16}$ to $2 \times 10^{18}$ atoms per $cm^3$, and the N+ emitter region has a surface concentration more than $10^{20}$ atoms per $cm^3$. Preferably, the N-type collector region has a donor doping concentration of $7 \times 10^{13}$ atoms per $cm^3$, the P-type base region has a surface concentration of $2 \times 10^{16}$ per $cm^3$ and junction depth of 23 micron, the first highly doped region has a surface concentration of $1 \times 10^{17}$ atoms per $cm^3$ and a junction depth of 15 micron, and the N+ emitter region has a surface concnetration of $1 \times 10^{21}$ atoms per $cm^3$ and a junction depth of 10 micron.

According to the present invention, there is also provided a method of fabricating a semiconductor device with breakdown voltage vertical transistor comprising the steps of: preparing a semiconductor substrate of a first conductivity type; forming a first highly doped region of the first conductivity type in one major surface of the substrate to form a region for mounting a collector electrode thereon; implementing a first selective conversion to the opposite major surface of the substrate to form a base region of a second conductivity type; implementing a second selective conversion to the thus formed base region to form an emitter region of the first conductivity within the base region; selectively and concurrently forming third highly doped regions of the second conductivity type within the base region and the remaining portion of the opposite major surface of the substrate, respectively, the remaining portion being leterally spaced from the base region; forming electrodes on the first higly doped region, the second highly doped region serving as the emitter region, and a predetermined one of the third highly doped regions, respectively; and forming a connection conductor connecting, on the substrate, the remaining third highly doped regions with each other respectively formed within the base region and the remaining portion of the opposite major surface of the substrate.

In accordance with the above-featured semiconductor device of the present invention, a doped region for forming a PN-junction of a clamping diode is provided within a collector region so that it is laterally spaced from a base region and is electrically connected to the base through a connection conductor. Even if a large overvoltage, e.g., 400 to 500 volts is impressed across the collector and the emitter of the transistor, followed by a phenomenon that a large number of electrons are injected from the emitter region to the base region, these electrons drift through the base region and most of them recombine in the vicinity of the connection conductor so as to eventually vanish. Accordingly, there is no possibility that injected electrons from the emitter pass through the base region to reach the N-type collector region, thus eliminating the parasitic transistor effect as encountered with the prior art described in the above-mentioned Japanese Patent Application Laid-open specification.

BRIEF DESCRIPTION OF THE DRAWINGS

The features and advantages of a high breakdown voltage vertical type transistor device and a fabricating method therefor will become more apparent from the description in conjunction with the accompnying drawings, in which.

DESCRIPTION OF THE PREFERRED EMBODIMENT

A preferred embodiment of the invention will be discribed with reference to attached drawings.

Figure 1:
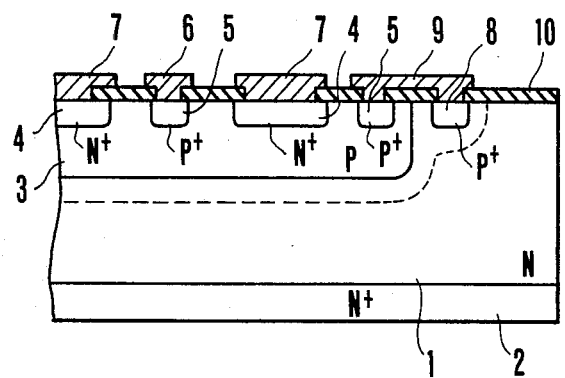
FIG. 1 is sectional view schematically illustrating an embodiment of a semiconductor device with high breakdown voltage vertical transistor according to the present invention.

FIG. 1 shows a sectional view illustrating an embodiment of a semiconductor device according to the present invention. Although the semiconductor device is actually manufactured so as to include a plurality of transistor areas, only a single transistor area will be described for the brevity of explanation. The semiconductor device of the embodiment includes a vertical transistor comprising an N+ region 2 for mounting thereon a collector electrode (not shown) formed on one major surface of an N-type semiconductor substrate 1, P-type base region 3. and an N+ emitter region 4 which are formed in the opposite major surface of the semiconductor substrate 1, P+ ohmic contact regions 5 formed within the base region 3, a base electrode 6 formed directly above one ohmic contact region 5 (located on the left in figure), and an emitter electrode 7 formed directly above the emitter region 4. The semiconductor device further includes a P+doped region 8 for forming the junction of a clamping diode formed within the collector region in the opposite major surface of the semiconductor substrate 1, and an connection conductor 9, electrically connecting on the substrate 1, the other P+ ohmic contact region (located on the right in figure) formed within the base region 3 with the P+ doped region 8. In addition, an insulating oxide film referred to as 10 is provided on the opposite major surface of the substrate 1. The setting of the depth and the concentration of the P+ doped region 8 is made such that a breakdown voltage of the junction formed between the region 8 and the collector region is lower than a collector/emitter breakdown voltage $V_{CEO}$ across the collector and emitter of the vertical transistor.

When a voltage higher than a collector/base voltage $V_{CB}$ of the transistor is impressed across the collector electrode (not shown) formed on the N+ region 2 and the emitter electrode 7, the junction formed between the P+ doped region 8 and the collector region breaks down. As a result, a breakdown current produced thereby flows in part through the connection conductor 9 into the base region 3 to serve as a hole current. On the other hand, electrons injected from the emitter region 4 to the base region 3 drift into the base region and recombination thereof occurs within the P-type base region 3, with the result that they vanish. Accordingly, there is no possibility that injected electrons from the emitter region pass through the base region 3 to arrive at the adjoining N-type collector region of the substrate 1. Thus, a parasitic transistor action in these three region s adjoined to each other is prevented. Accordingly, a secondary breakdown phenomenon of the transistor also does not occur, thus making it possible to sufficiently protect the transistor against an overvoltage of 400 to 500 volts.

Figure 2:
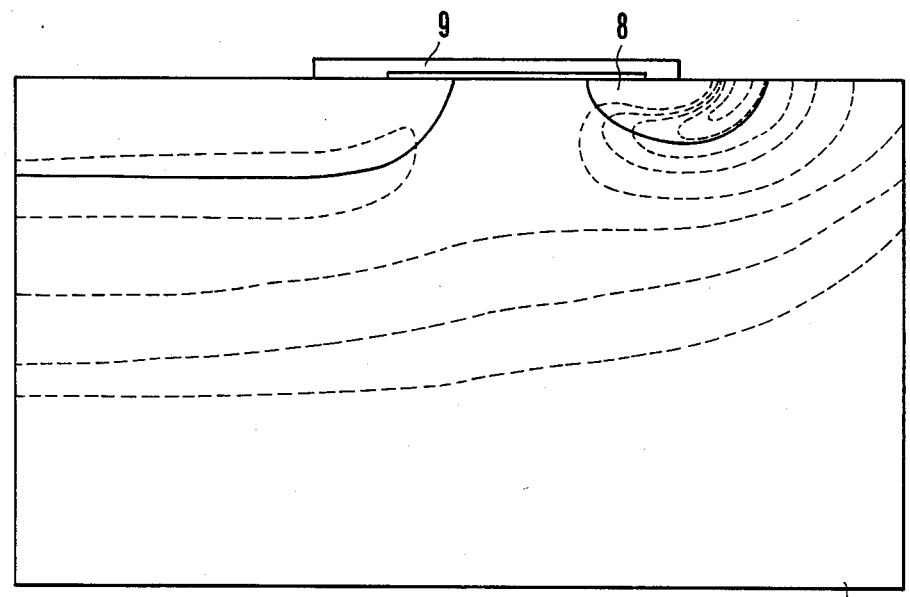
FIG. 2 is a view showing an electric field intensity distribution obtained by calculation when an overvoltage is applied to a clamping diode structure employed in the present invention.

FIG. 2 graphically shows an electric field intensity distribution when an overvoltage is applied to the clamping diode structure according to the present invention, wherein the electric field intensity distribution is obtained by solving two dimensional Poisson's equation in semiconductor and dielectric areas expressed below under geivn boundary conditions, $$\frac{d^2\psi}{dx^2} + \frac{d^2\psi}{dy^2} = \frac{B}{C}\{\Gamma(x, y) + P(x, y) - N(x, y)\}$$

where $\psi$ represents an electric potential at a point expressed by the coordinates (x, y), $\Gamma(x, y)$ an impurity concentration at a point expressed by the coordinates (x, y), and P(x, y) and N(x, y) P- and N-type carrier densities at a point expressed by the coordinates (x, y), respectively. As apparent from the calculated result, the maximum electric field intensity does not occur in the collector-base junction of the transistor, but occurs in curved edge portions of the P+ doped region 8. Accordingly, it is understood that a breakdown occurs in the curved edge portions. For instance, in the case where the collector region of the N-type substrate 1 has a doping concentration of $7 \times 10^{13}$ atoms/cm$^3$ and the P-type base region 3 has a surface concentration of $2 \times 10^{16}$ atoms/cm$^3$ and a depth of 23 micron, when the setting is made such that the P+ doped region 8 has a surface concentration of $1 \times 10^{17}$ atoms/cm$^3$ and a depth of 15 micron, it is possible to set the breakdown voltage of the junction formed between the P+ doped region 8 and the collector region at approximately 500 volts when assumption is made such that the collector/base breakdown voltage $V_{CBO}$ of the transistor is nearly equal to 700 V and the collector/emitter breakdown voltage $V_{CEO}$ is nearly equal to 550 V. It is preferable that, under the application of, depletion regions respectively extending from the P-type base region 3 and the P+ doped region 8 are formed at a breakdown voltage in a manner that they are contiguously adjoined to each other. In the event that there is a disconnection between both the depletion regions, the relaxation of an electric field strength at a curved edge portion of the jucntion between the P-type base region 3 and the collector region cannot be sufficiently effected. This means that the collector/emitter breakdown voltage $V_{CEO}$ is lowered. On the other hand, when both the depletion regions overlap with each other, electric field locally concentrates at a portion of high impurity concentration, resulting in the same undesired phenomenon. Under these conditions, the optimum spacing d between these regions is such that the distance between junction edges is approximately 22 micron.

Figure 3:
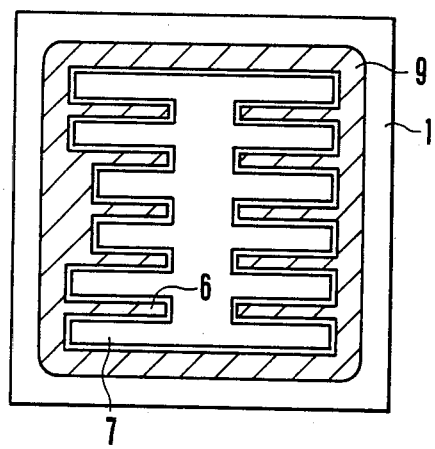
FIG. 3 is a plan view of the semiconductor device shown in FIG. 1.

FIG. 3 is a plan view of the semiconductor device with high breakdown voltage vertical transistor shown in FIG. 1 wherein there is in paticular illustrated an arrangement of electrodes 6 and 7 of the transistor and the connection conductor 9 of the clamping diode. In this figure, the connection conductor 9 and the base electrode 6 are roughly hatched for facilitating visual identification, although such a hatching is not pertinent to indication in drawing.

Figure 4:
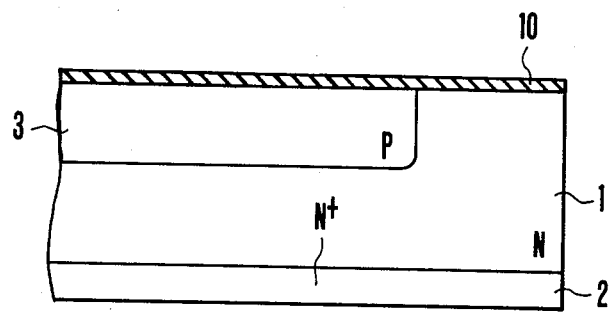
FIGS. 4 to 6 sectional views for explaining processes of fabricating a semiconductor device with high breakdown voltage vertical transistor according to the present invention, respectively.
Figure 5:
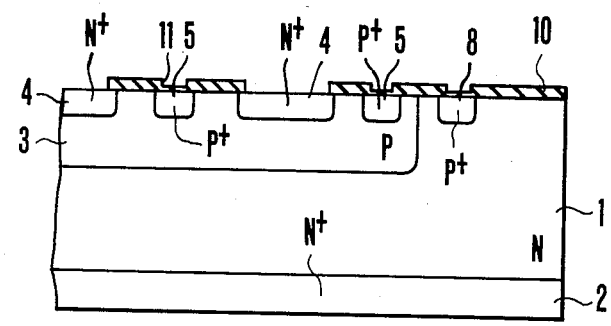
Figure 6:
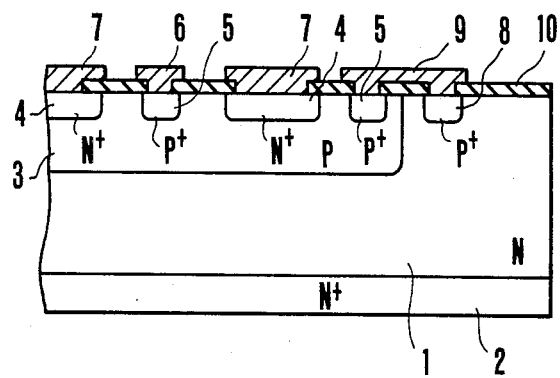

FIGS. 4 to 6 are schematic sectional views for explaining fabrication processes in the embodiment of a manufacturing method for semiconductor device with high breakdown vertical transistor according to the present invention.

As shown in FIG. 4, the N-type semiconductor substrate 1 is initially prepared. A highly doped region of the N-type serving as the region 2 for mounting the collector electrode thereon is formed on one major surface of the substrate 1.

Also, the P-type base region 3 is formed in the opposite major surface of the substrate 1 by using ordinary semiconductor fabrication technique. More particularly, first is to implement a selective conversion to the opposite major surface of the substrate 1 to form the P-type base region 3. Second is to implement a selective conversion to the base region 3 thus formed to form a highly doped region serving as the N+ emitter within the base region 3. In addition, the insulating oxide film 10 is deposited over the entire opposite major surface of the substrate 1.

Subsequently, as shown in FIG. 5, opening is implemented to the insulating oxide film 10 formed on the P-type base region 3 provided with the N+ emitter region 4 and on the remaining portion of the substrate 1 serving as the collector region, thus forming a plurality of windows 11. Then, P-type dopants are concurrently injected at the same concentration into the above-mentioned two regions, i.e., the base region 3 and the remaining region laterally spaced therefrom through the windows 11, thus to form at the same time highly doped regions serving as ohmic contact regions 5 and serving as a region for forming the PN-junction of the clamping diode within the base region 3 and the spaced-apart collector region, respectively. In this instance, the concentration and the depth of the dopants injected are determined by the forming conditions of the higly doped region 8. For injecting such dopants, there may be employed a thermal diffusion method or an ion-implantation method etc. Thereafter, the emitter region 4 is formed by diffusion. Finally, by well known measures, e.g., aluminum vacuum deposition or polycrystalline silicon formation etc., the base and emitter electrodes 6 and 7 are formed on the P+ ohmic contact region 5 of the base region 3 and the N+ emitter region 4, respectively, and the connection conductor 9 is formed so as to electrically connect the P+ higly doped region 8 for forming the PN-junction of the clamping diode with the P+ ohmic contact region 5 within the base region. Thus, the semiconductor device in which the high breakdown vertical transistor and the clamping diode are monolithically formed as shown in FIG. 6 is formed.

In accordance with the fabrication method according to the present invention, the ohmic contact regions and the junction region of the clamping diode are concurrently formed and the fabrication process can be decreased in contrast to the technique described in the above-mentioned published patent specification. This provides the advantage that transistor devices can be efficiently fabricated.

For better understanding of the invention, quantitative discussion in regard to the advantages therewith will be made.

A breakdown voltage value of a PN-junction of planar type is in general calculated by the following approximate equation, $$BV \text{ planar} = BV \text{ plane} [\sqrt{2r + r^2} - r] \quad (1)$$

where BV plane represents a breakdown voltage value of a plane junction, and r a factor determined by a ratio of a depth $x_{jp}$ of the junction and a spreading distance $x_d$ of a depletion layer when the plane junction is subject to breakdown (i.e., $r = x_{jp}/x_d$).

The breakdown voltage value BV of the plane junction is expressed by the following equation, $$BV \text{ plane} = K_s \epsilon_0 \epsilon_{crit}^2 / 2q N_d \quad (2)$$

where $K_s$ represents a relative dielectric constant (11.8), $\epsilon_0$ a dielectric constant in vacuum ($8.86 \times 10^{-14}$ F/cm), $\epsilon_{crit}$ a critical electric field intensity, q a charge quantity ($1.6 \times 10^{-19}$ C) and $N_d$ a donor doping concentration.

Figure 7:
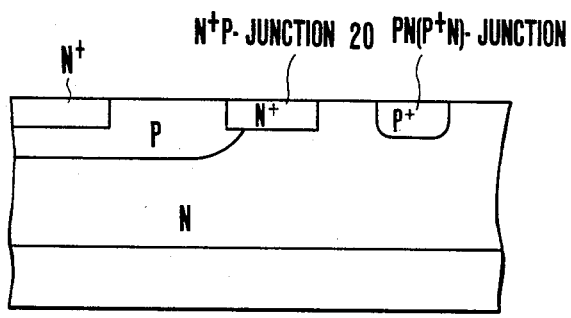
FIG. 7 is a diagram for explaining breakdown voltage at PN-junctions.

Referring to FIG. 7, in a Zener diode functioning as a clamping diode formed by the PN-junction or P+N-junction between the P+ highly doped region and the N-type collector region newly proposed by the invention, its breakdown voltage is determined at a curved edge portion of the junction, which value is approximated by the equation (1).

In contrast, it is very difficult to obtain an approximate equation for precisely calculating a breakdown voltage of a Zener diode formed by the N+P-junction between the N+ region 20 and the P-type base region known in the art because a junction profile is complicated. Accordingly, an attempt is made to estimate this breakdown voltage based on the one-dimensional approximate equation (2) by taking into account the fact that a region close to the surface has high doping concentration.

Based on the above premise, a comparison therebetween will be made.

In case where an attempt is made to fabricate a power transistor having a breadkdown voltage value more than 500 volts provided with the clamping diode formed by the P+-junction proposed by the present invention, a representative example of a junction profile is featured by the following parameters as previously described. That is, the N-type collector region has a donor doping concentration $N_d$ of $7 \times 10^{13}$ atoms cm$^{-3}$, the P-type base region has a surface concentration $N_{sp}$ of $2 \times 10^{16}$ atoms cm$^{-3}$ and a junction depth $x_{jp}$ of 23 micron, the P+ highly doped region for forming the junction of the clamping diode has a surface concentration Nsp of $1 \times 10^{17}$ atomic cm$^{-3}$ and a junction depth $x_{jp}$ 15 micron, and the N+ emitter region has a surface concentration $N_{sN+}$ of $1 \times$ cm$^{-3}$ and a junction depth $x_{jN+}$ of 10 micron.

Based on the parameters of the above-mentioned junction profile, by using the equation (1), the junction breakdown voltage $V_{CBO}$ of the collector and the breakdown voltage $V_{clamp}$ of the clamping diode are calculated as follows:

$V_{CBO} = 900$ V (700 V, observed)

$V_{clamp} = 770$ V (500 V, observed).

On the other hand, by using the equation (2), the breakdown voltage of the Zener diode formed by the emitter-base junction as shown at N+P-junction in FIG. 7 is calculated as follows:

$$V_{N+P} = \frac{11.7 \times 8.86 \times 10^{-14} \times (3 \times 10^5)^2}{2 \times 1.6 \times 10^{-19} \times (2 \times 10^{16})} = 15 \text{ V}.$$

As understood from this calculated result, the breakdown voltage using the N+ emitter region is an extremely small value as compared to the breakdown voltage obtained with the present invention because it is determined by the surface concentration $N_{sp}$ of the P-type base region.

When an attempt is made to raise the breakdown voltage value of the emitter-base junction, it is necessary to lower a surface concentration of the P-type base to a great extent (e.g. if the setting is made such that the surface concentration is $1 \times 10^{15}$ atoms cm$^{-3}$, the breakdown voltage rises to approximately 300 volts), or to lower the concentration of the emitter junction to such an extent that it becomes to the surface concentration of the P-type base region to realize a linearly slanting type junction.

In the former case (i.e. the surface concentration $N_{sp}$ of the P-type base region is reduced to a value of $1 \times 10^{15}$ atoms cm$^{-3}$), since the concentration at the junction in the surface is smaller one-tenth than that in an ordinary case, inversion is likely to occur in the vicinity of a boundary surface between an oxide film and the base region, with the result that reliability (experimentarily confirmed by a bias test) is remarkably lowered. In contrast, in the latter case, if the concentration of the emitter junction is reduced to the order of $10^{18}$ atoms cm$^{-3}$ which is comparable to that of the base layer, there takes places lowering of the emitter injection efficiency, casuing the current amplification factor ($h_{FE}$) to be lowered. Accordingly, a transistor device fabricated by using either method mentioned-above has characteristics inferior to those of ordinary devices, thus being far beyond utilization.

For the reason stated above, there are not so many cases that a method of utilizing the N+ emitter region for the purpose of forming a Zener diode is actually employed, and therefore there is instead proposed another method of implementing ion-implantation to the surface to form and N+ layer having a low doping concentration as described in the above-mentioned Japanese Patent Application Laid-open. No. 57-34360. However, this method is not practically acceptable for the reason stated above.

Reference is finally made to the range where the advantages with the present invention can be obtained.

Consideration will be made on the assumption that a high breakdown voltage transistor having 400 to 500 volts or more can be fomed in accordance with the present invention. The parameter range of the Zener diode formed by the PN (or P+N) junction between the N-type collector region and the P+ highly doped region electrically connected to the P-type base region through the P+ ohmic contact region by means of the connection conductor.

Figure 8:
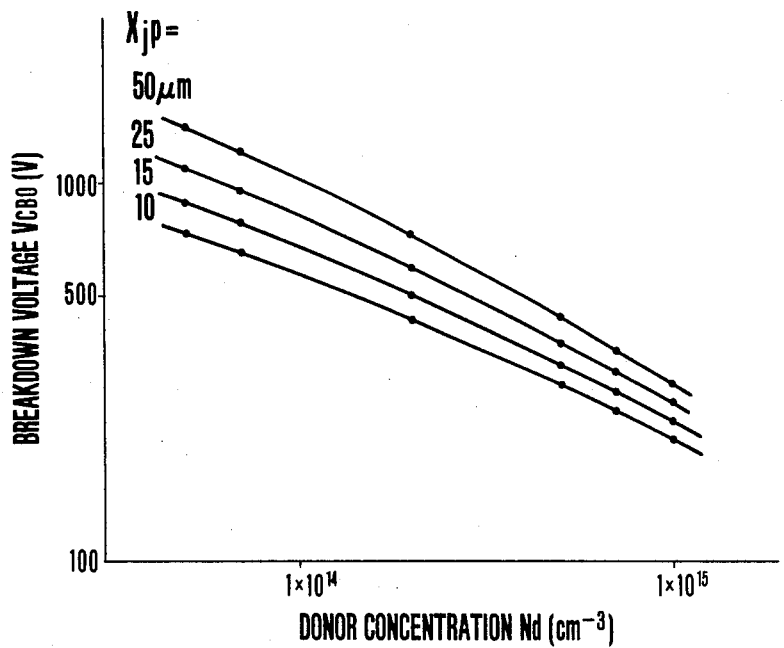
FIG. 8 is a graph showing the relationship between the breakdown voltage $V_{CBO}$ of the base-collector junction and the donor concentration N of the collector layer with the depth $x_{jp}$ of the junction being taken as a parameter.

The donor concentration $N_d$ of the collector region is expressed as $N_d \leq 2 \times 10^{14}$ atoms cm$^{-3}$. The junction depth $x_{jp}$ of the P-type base layer is expressed as $x_{jp} \leq 10$ micron and the surface concentration thereof is expressed as $1 \times 10^{16} \leq N_{sp} \leq 2 \times 10^{18}$ atoms cm$^{-3}$. The surface $N_{sp}$ of the base contact region (ohmic contact region) is expressed as $0.5 \times 10^{16} \leq N_{sp} \leq 2 \times 10^{18}$ atoms cm$^{-3}$. The N+ emitter layer has a surface concentration expressed as $N_{sn+} = 10^{20}$ atoms cm$^{-3}$. On the assumption that each parameter is set within the above-mentioned range, when calculation of the breakdown voltage $V_{CBO}$ of the collector junction is made using the equation (1), it is realized that $V_{CBO} > 400$ V. FIG. 8 shows a graph showing the relationship between the breakdown voltage $V_{CBO}$ and the donor concentration $N_d$ with the junction depth $x_{jp}$ being used as a parameter.

Then, calculation of the breakdown voltage of the conventional Zener diode formed by the N+ junction between the N+ emitter region and the P-type base region is made using the equation (2). As a result, the breakdown voltage value of the Zener diode is 0.1 to 30 volts. The breakdown voltage value of 30 volts is only possible at the most.

Accordingly, it is impossible to obtain a Zener voltage having a breakdown voltage of 400 to 500 volts by using the junction of N+P structure. For this reason, it is necessary to employ the P+N structure restricted by the above-mentioned impurity profile. As seen from FIG. 8, breakdown voltage $V_{CBO}$ is less than 430 volts when there are employed other impurity profiles having a donor concentration less than $2 \times 10^{14}$ atoms cm$^{-3}$ and a junction depth larger than 10 micron.

In the case of the present invention, it is experimentally confirmed that the P-type base layer can be formed with its surface concentration raging from $1 \times 10^{16}$ to $2 \times 10^{18}$ atoms cm$^{-3}$ when an ordinary gas diffusion (BCl$_3$ diffusion) method or an ion-implantation method is employed although the surface concentration varies in dependence upon an impurity diffusion method employed. In addition, it is also confirmed that the N-type emitter region can be formed by using an ordinary gas diffusion (POCl$_3$ diffusion) method within the above-mentioned range (more than $1 \times 10^{20}$ atoms cm$^{-3}$) in order not to lower the emitter injection efficiency.

In the above-mentioned embodiment, it has been described that the semiconductor device comprises the N-type substrate 1, the P-type base region, the N+ type emitter region, the P+ ohmic contact regions 5 and the P+ highly doped region. However, the present invention is applicable to a semiconductor device comprising corresponding regions of opposite conductivity types to the above-mentioned regions, respectively.

As described in detail, the high breadkown voltage transistor according to the present invention can be produced with an extremely high efficiency and has a high breakdown voltage of 400 to 500 volts. Accordingly, when used as a high power switching transistor device, excelent advantages can be obtained.

What is claimed is:

1. A semiconductor device with a high breakdown voltage vertical transistor comprising:
    a collector region of a first conductivity type;
    a base region of a second conductivity type formed in said collector region;
    an emitter region of said first conductivity type formed within said base region,
    said collector region, said base region and said emitter region forming a vertical transistor having a predetermined breakdown voltage across said collector region and said emitter region;
    a highly doped clamping diode region of the second conductivity type formed within said collector region and laterally spaced from said base region and forming a junction having a breakdown voltage lower than the predetermined breakdown voltage together with said collector region to form a clamping diode; and
    a connection conductor for electricity connecting said base region with said clamping diode region.

2. A semiconductor device according to claim 1, further comprising:
    at least two highly doped ohmic contact regions formed within said base region, said connection conductor being formed so as to connect said clamping diode region with one of said ohmic contact regions.

3. A semiconductor device according to claim 1, wherein said clamping diode region is spaced from said base region to such an extent that said clamping diode region and said base region are contiguously joined by depletion layers extending from said respective regions when the breakdown voltage of said vertical transistor is applied.

4. A semiconductor device according to claim 1, wherein said clamping diode region has the same doping concentration as that of each of said ohmic contact regions.

5. A semiconductor device according to claim 1, wherein said collector region comprises a semiconductor substrate having a first surface on which said base region and said emitter region are formed and a second surface opposite said first surface, and wherein a region of said first conducting type is provided for mounting a collector electrode formed on the second surface.

6. A semiconductor device according to claim 2, further comprising:
    a base electrode formed directly on the other ohmic contact region and an emitter electrode formed directly on said emitter region.

7. A semiconductor device according to claim 5, further comprising:
    an insulating oxide film on the second surface of said substrate.

* * * * *